United States Patent
Tanaka et al.

(10) Patent No.: US 12,343,770 B2
(45) Date of Patent: Jul. 1, 2025

(54) CLEANING DEVICE AND CLEANING METHOD

(71) Applicant: EBARA CORPORATION, Tokyo (JP)

(72) Inventors: Yuki Tanaka, Tokyo (JP); Takeshi Iizumi, Tokyo (JP); Takayuki Kajikawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/924,939

(22) PCT Filed: May 14, 2021

(86) PCT No.: PCT/JP2021/018359
§ 371 (c)(1),
(2) Date: Nov. 11, 2022

(87) PCT Pub. No.: WO2021/230344
PCT Pub. Date: Nov. 18, 2021

(65) Prior Publication Data
US 2023/0191460 A1    Jun. 22, 2023

(30) Foreign Application Priority Data
May 15, 2020   (JP) .................. 2020-086242

(51) Int. Cl.
*B08B 3/02* (2006.01)
*H01L 21/02* (2006.01)
*H01L 21/67* (2006.01)

(52) U.S. Cl.
CPC .......... *B08B 3/02* (2013.01); *B08B 2240/00* (2013.01); *H01L 21/02052* (2013.01); *H01L 21/67005* (2013.01)

(58) Field of Classification Search
CPC . B08B 3/02; B08B 2240/00; H01L 21/02052; H01L 21/67005; H01L 21/67051; H01L 21/02057
See application file for complete search history.

(56) References Cited

U.S. PATENT DOCUMENTS 7,476,290 B2 *   1/2009   Saito .................. B08B 3/02
                                              15/300.1
10,170,344 B2 *  1/2019   Ishibashi .......... H01L 21/67051
(Continued)

FOREIGN PATENT DOCUMENTS

JP    2001-319909 A    11/2001
JP    2003-109936 A     4/2003
(Continued)

OTHER PUBLICATIONS

International Patent Application No. PCT/JP2021/018359; Int'l Search Report; dated Jul. 20, 2021; 4 pages.

*Primary Examiner* — Alexander Markoff
(74) *Attorney, Agent, or Firm* — BakerHostetler

(57) ABSTRACT

A cleaning device includes: a substrate rotation mechanism that holds and rotates a substrate around center axis thereof; a first single-tube nozzle that discharges first cleaning liquid toward a top surface of the substrate; and a second single-tube nozzle that discharges second cleaning liquid toward the top surface of the substrate. The first single-tube nozzle and the second single-tube nozzle are disposed such that the second single-tube nozzle discharges the second cleaning liquid in a forward direction of a rotation direction of the substrate at a position farther away from the center of the substrate than a landing position of the first cleaning liquid, and a part is generated in which liquid flow on the top surface of the substrate after landing of the first cleaning
(Continued)

liquid and liquid flow on the top surface of the substrate after landing of the second cleaning liquid are combined.

18 Claims, 7 Drawing Sheets

(56) References Cited

U.S. PATENT DOCUMENTS

| | | | |
|---|---|---|---|
| 11,164,758 B2* | 11/2021 | Ishibashi | B08B 3/024 |
| 11,850,635 B2* | 12/2023 | Son | B08B 3/08 |
| 2001/0037858 A1 | 11/2001 | Taniyama et al. | |
| 2007/0044823 A1* | 3/2007 | Yamamoto | H01L 21/67051 |
| | | | 134/36 |
| 2014/0261570 A1* | 9/2014 | Orii | H01L 21/02052 |
| | | | 134/144 |
| 2015/0348806 A1* | 12/2015 | Ishibashi | B08B 3/024 |
| | | | 15/103.5 |
| 2016/0086810 A1* | 3/2016 | Fujiwara | B08B 3/024 |
| | | | 156/345.21 |
| 2016/0096203 A1* | 4/2016 | Kai | H01L 21/31133 |
| | | | 134/30 |
| 2021/0129194 A1* | 5/2021 | Ishibashi | B08B 3/02 |
| 2023/0090997 A1* | 3/2023 | Inukai | B08B 3/02 |
| | | | 134/18 |
| 2023/0098666 A1* | 3/2023 | Zhu | H01L 21/67259 |
| | | | 134/13 |

FOREIGN PATENT DOCUMENTS

| | | |
|---|---|---|
| JP | 2014-199917 A | 10/2014 |
| JP | 2015-201627 A | 11/2015 |

* cited by examiner

CLEANING DEVICE AND CLEANING METHOD

TECHNICAL FIELD

The present disclosure relates to a cleaning device and a cleaning method.

BACKGROUND

In a step of manufacturing a semiconductor device, various processes such as film formation, etching, and polishing are performed on a surface of a substrate such as a semiconductor wafer. Since it is necessary to keep the surface of the substrate clean before and after these various processes, a cleaning process of the substrate is performed. For example, after a polishing step of polishing a film of a metal or the like formed on the substrate, cleaning for removing minute particles (defects) such as polishing wastes and abrasive grains contained in a polishing agent is performed. In this cleaning step, a cleaning effect is promoted by supplying a cleaning liquid onto the substrate (for example, see JP2015-201627A).

SUMMARY

However, depending on a type of a nozzle for supplying the cleaning liquid, a flow rate of the cleaning liquid, a discharge position of the cleaning liquid on the substrate, and a rotation speed of the substrate, the cleaning liquid is not effectively supplied over the entire surface of the substrate, which may lead to a decrease in semiconductor manufacturing efficiency and a decrease in the effect of removing the minute particles (defects) remaining on the substrate after polishing.

With the progress of miniaturization, there is an increasing demand for the removal quality of minute particle contamination adhering to the substrate. In a series of cleaning processes performed when the substrate is cleaned in a single wafer type, for example, a process including a series of cleaning steps of performing scrub cleaning to remove particle contamination having a relatively large particle diameter and then performing non-contact cleaning to remove particle contamination having a relatively small particle diameter may be performed, but at that time, different types of cleaning processes (different types of cleaning steps) are continuously performed, so that a total cleaning time is required. However, if the processing time is simply shortened in order to improve the throughput, there is a concern that the removal rate of particle contamination is rather lowered.

In addition, for example, a foreign material such as minute polishing wastes that are relatively difficult to remove remains on the substrate after a polishing step is performed using minute polishing slurry such as ceria, and the surface of the substrate to be processed does not necessarily have uniform properties. Therefore, application of more advanced cleaning technology than before has been required for cleaning technology after substrate polishing.

In addition, there is a concern that the total time of the cleaning process required to achieve the predetermined cleaning quality becomes long as the processing step of the entire cleaning step becomes complicated, and this is not preferable from the viewpoint of the throughput.

It is desirable to provide a cleaning device and a cleaning method capable of improving replacement efficiency of a cleaning liquid on a substrate. In addition, it is desirable to provide a cleaning device and a cleaning method capable of realizing a cleaning step capable of achieving improved particle contamination removal performance as compared with the related art while increasing the throughput when a substrate cleaning process is performed. In addition, it is desirable to provide a cleaning device and a cleaning method with an improved ability to remove minute particles and the like on an entire substrate surface.

A cleaning device according to one aspect of the present disclosure includes:

- a substrate rotation mechanism that holds a substrate and rotates the substrate around a center axis of the substrate as a rotation axis;
- a first single-tube nozzle that discharges a first cleaning liquid toward a top surface of the substrate held by the substrate rotation mechanism; and
- a second single-tube nozzle that discharges a second cleaning liquid toward the top surface of the substrate held by the substrate rotation mechanism separately from the first single-tube nozzle, wherein
- the first single-tube nozzle and the second single-tube nozzle are disposed such that the second single-tube nozzle discharges the second cleaning liquid in a forward direction of a rotation direction of the substrate at a position farther away from the center of the substrate than a landing position of the first cleaning liquid, and a part is generated in which a liquid flow on the top surface of the substrate after landing of the first cleaning liquid and a liquid flow on the top surface of the substrate after landing of the second cleaning liquid are combined.

A cleaning method according to one aspect of the present invention includes:

- a step of rotating a substrate around a center axis of the substrate as a rotation axis;
- a step of discharging a first cleaning liquid from a first single-tube nozzle toward a top surface of the substrate; and
- a step of discharging a second cleaning liquid from a second single-tube nozzle toward the top surface of the substrate separately from the first single-tube nozzle, wherein
- in the step of discharging the second cleaning liquid, the second single-tube nozzle discharges the second cleaning liquid in a forward direction of a rotation direction of the substrate at a position farther away from the center of the substrate than a landing position of the first cleaning liquid such that a part is generated in which a liquid flow on the top surface of the substrate after landing of the first cleaning liquid and a liquid flow on the top surface of the substrate after landing of the second cleaning liquid are combined.

DESCRIPTION OF EMBODIMENTS

Figure 1:
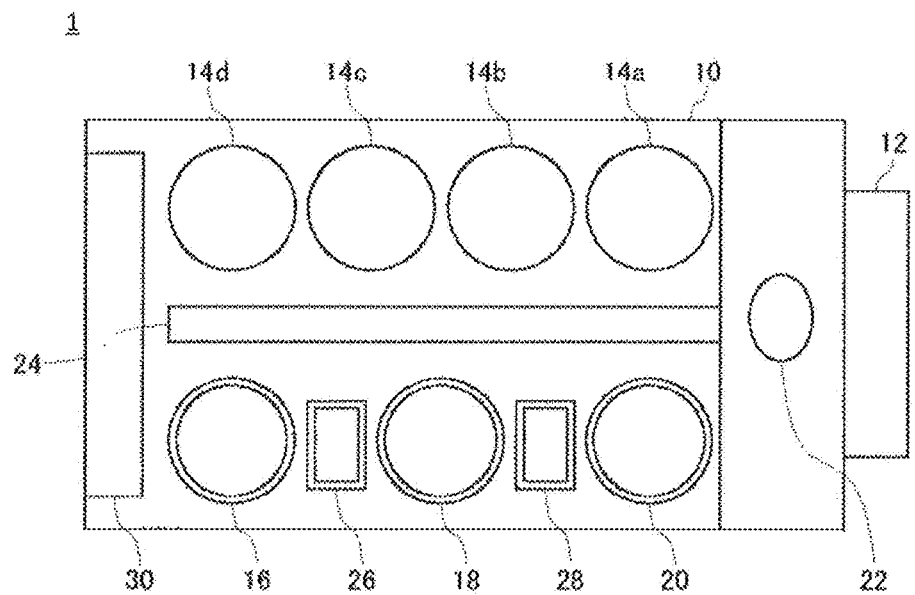
FIG. 1 is a plan view illustrating an entire configuration of a substrate processing apparatus including a cleaning device according to an embodiment.

A cleaning device according to a first aspect of an embodiment includes:
- a substrate rotation mechanism that holds a substrate and rotates the substrate around a center axis of the substrate as a rotation axis;
- a first single-tube nozzle that discharges a first cleaning liquid toward a top surface of the substrate held by the substrate rotation mechanism; and
- a second single-tube nozzle that discharges a second cleaning liquid toward the top surface of the substrate held by the substrate rotation mechanism separately from the first single-tube nozzle, wherein
- the first single-tube nozzle and the second single-tube nozzle are disposed such that the second single-tube nozzle discharges the second cleaning liquid in a forward direction of a rotation direction of the substrate at a position farther away from the center of the substrate than a landing position of the first cleaning liquid, and
- a part is generated in which a liquid flow on the top surface of the substrate after landing of the first cleaning liquid and a liquid flow on the top surface of the substrate after landing of the second cleaning liquid are combined.

According to an actual verification by the present inventors, by such an aspect, replacement efficiency of the cleaning liquid on the substrate can be improved regardless of a rotation speed of the substrate as compared with a case of using other types of nozzles. As a result, it is possible to improve both liquid supply efficiency to the top surface of the substrate and a particle removal rate on the surface of the substrate as compared with rinse cleaning using a conventional nozzle, and it is possible to achieve both improvement in cleaning performance and improvement in throughput in a substrate cleaning step.

According to a cleaning device according to a second aspect of the embodiment, in the cleaning device according to the first aspect,
- a flow rate of the first cleaning liquid discharged from the first single-tube nozzle is larger than a flow rate of the second cleaning liquid discharged from the second single-tube nozzle.

According to an actual verification by the present inventors, by such an aspect, replacement efficiency of the cleaning liquid on the substrate can be further improved.

According to a cleaning device according to a third aspect of the embodiment, in the cleaning device according to the second aspect,
- a diameter of the first single-tube nozzle is larger than a diameter of the second single-tube nozzle.

According to a cleaning device according to a fourth aspect of the embodiment, in the cleaning device according to any one of the first to third aspects,
- discharge of the first cleaning liquid by the first single-tube nozzle and discharge of the second cleaning liquid by the second single-tube nozzle are performed simultaneously.

According to a cleaning device according to a fifth aspect of the embodiment, in the cleaning device according to any one of the first to fourth aspects,
- the first cleaning liquid and the second cleaning liquid are water or a chemical liquid.

According to a cleaning device according to a sixth aspect of the embodiment, in the cleaning device according to any one of the first to fifth aspects,
- the first single-tube nozzle discharges the first cleaning liquid such that the first cleaning liquid lands before the center of the substrate and a liquid flow of the first cleaning liquid on the top surface of the substrate after landing passes through the center of the substrate.

According to a cleaning device according to a seventh aspect of the embodiment, in the cleaning device according to any one of the first to sixth aspects,
- a distance from the center of the substrate to the landing position of the second cleaning liquid is longer than ¼ of a radius of the substrate.

According to a cleaning device according to an eighth aspect of the embodiment, in the cleaning device according to the seventh aspect,
- a distance from the center of the substrate to the landing position of the second cleaning liquid is longer than ⅓ of a radius of the substrate.

According to a cleaning device according to a ninth aspect of the embodiment, in the cleaning device according to any one of the first to eighth aspects,
- an angle between a liquid flow from being discharged from the first single-tube nozzle to landing on the top surface of the substrate and the top surface of the substrate is 15° to 75°.

According to a cleaning device according to a tenth aspect of the embodiment, in the cleaning device according to any one of the first to ninth aspects,
- an angle between a liquid flow from being discharged from the second single-tube nozzle to landing on the top surface of the substrate and the top surface of the substrate is 15° to 75°.

According to a cleaning device according to an eleventh aspect of the embodiment, in the cleaning device according to any one of the first to tenth aspects, the number of second single-tube nozzles is two or more.

A cleaning method according to a twelfth aspect of the embodiment includes:
- a step of rotating a substrate around a center axis of the substrate as a rotation axis;
- a step of discharging a first cleaning liquid from a first single-tube nozzle toward a top surface of the substrate; and
- a step of discharging a second cleaning liquid from a second single-tube nozzle toward the top surface of the substrate separately from the first single-tube nozzle, wherein
- in the step of discharging the second cleaning liquid, the second single-tube nozzle discharges the second cleaning liquid in a forward direction of a rotation direction of the substrate at a position farther away from the center of the substrate than a landing position of the first cleaning liquid such that a part is generated in which a liquid flow on the top surface of the substrate after landing of the first cleaning liquid and a liquid flow on the top surface of the substrate after landing of the second cleaning liquid are combined.

Hereinafter, specific examples of embodiments will be described in detail with reference to the accompanying drawings. In the following description and the drawings used in the following description, the same reference numerals will be used for parts that can be configured in the same way, and redundant descriptions will be omitted. In addition, unless otherwise specified, "above" means a direction in which a cleaning tool such as a cleaning nozzle exists with a substrate as a starting point, and "below" means an opposite direction thereof. When a cleaning tool such as a cleaning nozzle exists on both surfaces of the substrate, a direction in which a specific cleaning nozzle or the like exists is defined as "above", and "below" means an opposite direction thereof. In addition, regarding a cleaning nozzle and components constituting the cleaning nozzle, a "top surface" and a "surface" mean a surface on a side on which a specific cleaning nozzle supplies a liquid to the substrate.

FIG. 1 is a plan view illustrating an entire configuration of a substrate processing apparatus (also referred to as a polishing apparatus) 1 including a cleaning device according to an embodiment.

As illustrated in FIG. 1, the substrate processing apparatus 1 has a substantially rectangular housing 10 and a load port 12 on which a substrate cassette (not illustrated in the drawings) for stocking a plurality of wafers W (refer to FIG. 2 or the like) is placed. The load port 12 is disposed to be adjacent to the housing 10. The load port 12 can be equipped with an open cassette, a standard manufacturing interface (SMIF) pod, or a front opening unified pod (FOUP). The SMIF pod and the FOUP are closed containers that can maintain the environment independent of an external space by accommodating the substrate cassette inside and covering the substrate cassette with a partition wall. As the wafer W, for example, a semiconductor wafer or the like can be mentioned.

A plurality of (four in an aspect illustrated in FIG. 1) polishing units 14a to 14d, a first cleaning unit 16 and a second cleaning unit 18 that clean the polished wafer W, and a drying unit 20 that dries the cleaned wafer W are accommodated in the housing 10. The polishing units 14a to 14d are arranged along a longitudinal direction of the housing 10, and the cleaning units 16 and 18 and the drying unit 20 are also arranged along the longitudinal direction of the housing 10.

A first transfer robot 22 is disposed in a region surrounded by the load port 12, the polishing unit 14a located at the side of the load port 12, and the drying unit 20. Further, a transfer unit 24 is disposed in parallel with the longitudinal direction of the housing 10, between a region where the polishing units 14a to 14d are arranged and a region where the cleaning units 16 and 18 and the drying unit 20 are arranged. The first transfer robot 22 receives the wafer W before polishing from the load port 12 and transfers the wafer W to the transfer unit 24 or receives the dried wafer W extracted from the drying unit 20 from the transfer unit 24.

A second transfer robot 26 that transfers the wafer W between the first cleaning unit 16 and the second cleaning unit 18 is disposed between the first cleaning unit 16 and the second cleaning unit 18. Further, a third transfer robot 28 that transfers the wafer W between the second cleaning unit 18 and the drying unit 20 is disposed between the second cleaning unit 18 and the drying unit 20.

Further, the substrate processing apparatus 1 is provided with a control device 30 for controlling the movement of each of the devices 14a to 14d, 16, 18 22, 24, 26, and 28. For example, a programmable logic controller (PLC) is used as the control device 30. In the aspect illustrated in FIG. 1, although the control device 30 is disposed inside the housing 10, the control device 30 is not limited thereto and may be disposed outside the housing 10.

In the example illustrated in FIG. 1, as the first cleaning unit 16, a roll cleaning device that brings a roll cleaning member extending in a horizontal direction into contact with a surface of the wafer W in the presence of a cleaning liquid, and scrubs and cleans the surface of the wafer W while rotating the roll cleaning member is used, and as the second cleaning unit 18, a pencil cleaning device that brings a columnar pencil cleaning member extending in a vertical direction into contact with the surface of the wafer W in the presence of the cleaning liquid, moves the pencil cleaning member in one direction parallel to the surface of the wafer W while rotating the pencil cleaning member, and scrubs and cleans the surface of the wafer W is used. As the drying unit 20, a spin drying device that jets isopropyl alcohol (IPA) vapor from an injection nozzle moving in one direction parallel to the surface of the wafer W toward the rotating wafer W to dry the wafer W and rotates the wafer W at a high speed to dry the wafer W by a centrifugal force is used.

In this example, the roll cleaning device is used as the first cleaning unit 16. However, as the first cleaning unit 16, a pencil cleaning device similar to the second cleaning unit 18 may be used, a buffing cleaning device that brings a buffing cleaning member having a rotation axis extending in the vertical direction into contact with the surface of the wafer W in the presence of the cleaning liquid, moves the buffing cleaning member in one direction parallel to the surface of the wafer W while rotating the buffing cleaning member, and scrubs, cleans, and polishes the surface of the wafer W may be used, or a two-fluid jet cleaning device that cleans the surface of the wafer W by a two-fluid jet may be used. In addition, in this example, the pencil cleaning device is used as the second cleaning unit 18. However, as the second cleaning unit 18, a roll cleaning device similar to the first cleaning unit 16 may be used, a buffing cleaning device may be used, or a two-fluid jet cleaning device may be used.

The cleaning liquid includes a rinse liquid such as pure water (DIW) and a chemical liquid such as ammonia hydrogen peroxide (SC1), hydrochloric acid hydrogen peroxide (SC2), sulfuric acid hydrogen peroxide (SPM), sulfuric acid hydration, or hydrofluoric acid. Unless otherwise noted in the present embodiment, the cleaning liquid means either the rinse liquid or the chemical liquid.

A cleaning device 40 (see FIG. 2) according to the embodiment can be applied to both the first cleaning unit 16 and the second cleaning unit 18, and can be applied to the roll cleaning device, the pencil cleaning device, the buffing cleaning device, and the two-fluid jet cleaning device.

Hereinafter, as a specific application example of the cleaning device 40 according to the embodiment, an aspect applied to rinsing and cleaning in the first cleaning unit 16 and the second cleaning unit 18 will be described. During the rinsing and cleaning, the roll cleaning member in the first cleaning unit 16 and the pencil cleaning member in the second cleaning unit 18 are retracted from above the substrate. This is to prevent particles and a chemical liquid attached to a member such as the roll cleaning member or the pencil cleaning member from dropping onto the substrate during the rinsing and cleaning and contaminating the substrate.

Figure 2:
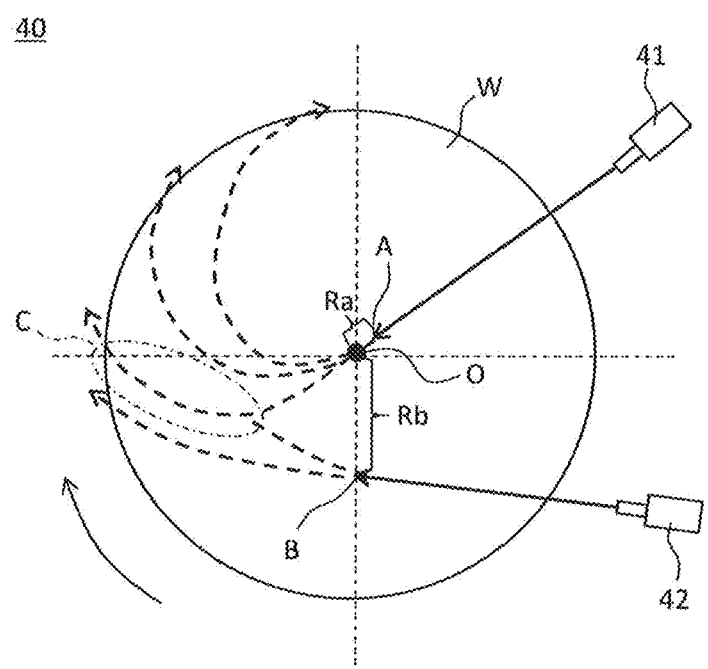
FIG. 2 is a plan view illustrating a positional relation between a substrate and a first single-tube nozzle and a second single-tube nozzle in the cleaning device according to the embodiment.

FIG. 2 is a plan view illustrating a positional relation between a substrate W and a first single-tube nozzle 41 and a second single-tube nozzle 42 in the cleaning device 40 according to the embodiment. In the present specification, a "spray nozzle" refers to a nozzle that has a large number of supply ports and discharges the cleaning liquid so as to spatially spread, and a "single-tube nozzle" refers to a nozzle that has a single supply port and relatively linearly discharges the cleaning liquid from the supply port, unlike the spray nozzle.

As illustrated in FIG. 2, the cleaning device 40 includes a substrate rotation mechanism 70 (see FIG. 13), a first single-tube nozzle 41 that discharges a first cleaning liquid toward a top surface of the substrate W held by the substrate rotation mechanism 70, and a second single-tube nozzle 42 that discharges a second cleaning liquid toward the top surface of the substrate W held by the substrate rotation mechanism 70 separately from the first single-tube nozzle 41.

Figure 13:
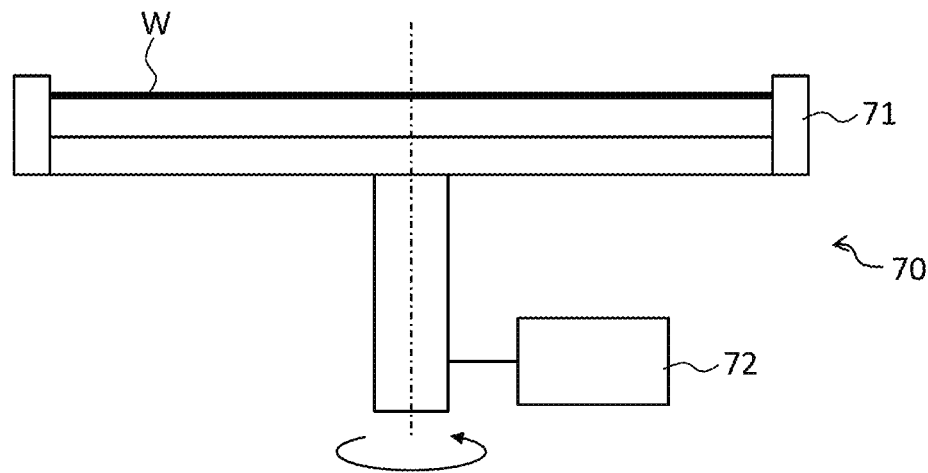
FIG. 13 is a side view illustrating a configuration of a substrate rotation mechanism in the cleaning device according to the embodiment.

FIG. 13 is a side view illustrating a configuration of the substrate rotation mechanism 70. As illustrated in FIG. 13, the substrate rotation mechanism 70 has a substrate holding mechanism 71 that horizontally holds the substrate W, and a motor (rotation mechanism) 72 that rotates the substrate W around its center axis via the substrate holding mechanism 71. Note that a substrate plate (not illustrated in the drawings) having a plurality of vacuum chuck holes disposed symmetrically with respect to a straight line including the axial center and communicating with a vacuum source may be adopted as the substrate holding mechanism 70.

The substrate W is held by the substrate holding mechanism 71 with a surface facing upward. When the substrate holding mechanism 71 holds and rotates the substrate W, the substrate W rotates around its center axis (axis passing through the center O and perpendicular to the surface of the substrate W) as a rotation axis. In the example illustrated in FIG. 2, the substrate W is rotated clockwise as viewed from above, but a rotation direction of the substrate W is not limited thereto and may be rotated counterclockwise as viewed from above.

As illustrated in FIG. 2, the first single-tube nozzle 41 and the second single-tube nozzle 42 discharge the cleaning liquid from above the substrate W and outside an upper space of the substrate W toward the surface (top surface) of the substrate W. That is, the first single-tube nozzle 41 and the second single-tube nozzle 42 supply the cleaning liquid from obliquely above the top surface of the substrate W. The discharge of the first cleaning liquid by the first single-tube nozzle 41 and the discharge of the second cleaning liquid by the second single-tube nozzle 42 may be performed simultaneously.

Figure 14:
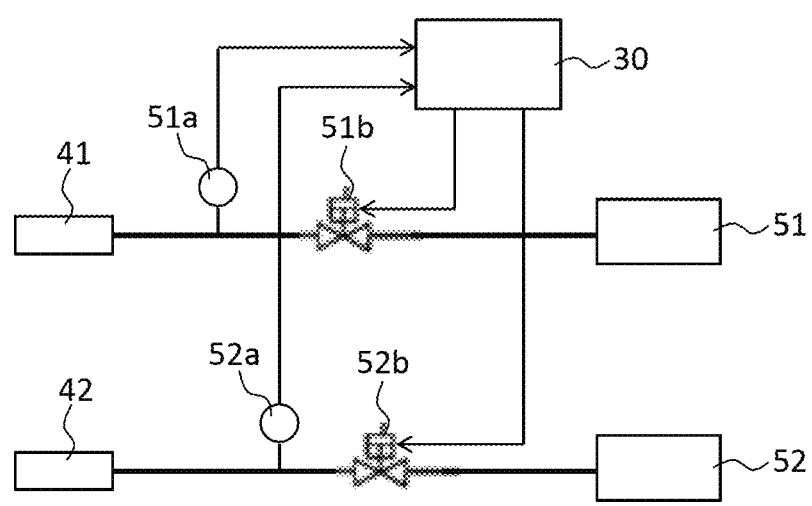
FIG. 14 is a schematic view illustrating a configuration of a flow rate adjustment mechanism in the cleaning device according to the embodiment.

In one embodiment, a flow rate of the first cleaning liquid discharged from the first single-tube nozzle 41 can be larger than a flow rate of the second cleaning liquid discharged from the second single-tube nozzle 42. Therefore, as illustrated in FIG. 14, a first valve 51a capable of adjusting an opening and a first flowmeter 51b are installed on a pipe connecting a chemical liquid supply source 51 of the first cleaning liquid and the first single-tube nozzle 41, and a second valve 52a capable of adjusting an opening and a second flowmeter 52b are installed on a pipe connecting a chemical liquid supply source 52 of the second cleaning liquid and the second single-tube nozzle 42. In addition, a control unit 30 receives flow rate signals from the first flowmeter 51b and the second flowmeter 51b, and transmits opening adjustment signals to the first valve 51a and the second valve 52a during the operation of the cleaning process so as to be within a preset flow rate range, thereby feedback-controlling the openings of the first valve 51a and the second valve 52a. As a result, the flow rate of the first cleaning liquid discharged from the first single-tube nozzle 41 can be larger than the flow rate of the second cleaning liquid discharged from the second single-tube nozzle 42.

The position, discharge direction, diameter, and flow velocity of the first single-tube nozzle 41 are designed such that the first cleaning liquid discharged from the first single-tube nozzle 41 satisfies the following conditions. First, as illustrated in FIG. 1, a landing position A of the first cleaning liquid discharged from the first single-tube nozzle 41 on the top surface of the substrate W is not the center O of the substrate W but a position separated from the center O of the substrate W by a distance Ra. The direction of the first single-tube nozzle 41 is determined such that the center O of the substrate W is on a line connecting the first single-tube nozzle 41 and the landing position A in plan view. That is, the first single-tube nozzle 41 discharges the first cleaning liquid toward the center O of the substrate W in plan view, but the landing position A is a position before the center O of the substrate W by the distance Ra.

Figure 3:
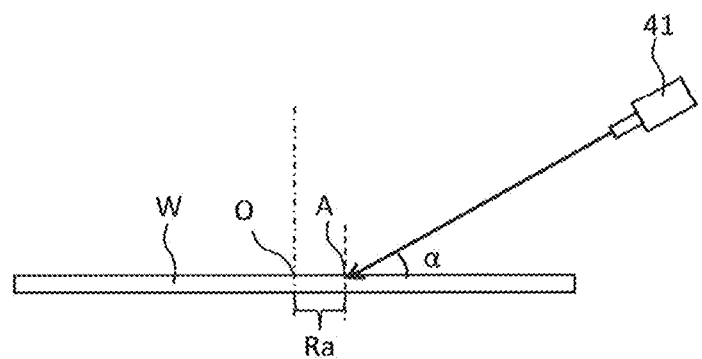
FIG. 3 is a side view illustrating a positional relation between the substrate and the first single-tube nozzle in the cleaning device according to the embodiment.

FIG. 3 is a side view illustrating a positional relation between the substrate W and the first single-tube nozzle 41. FIG. 3 illustrates a vertical surface including a liquid flow of the first cleaning liquid until the first cleaning liquid is discharged from the first single-tube nozzle 41 and lands on the top surface of the substrate W. As illustrated in FIG. 3, an angle (incidence angle) a between the liquid flow of the first cleaning liquid until the first cleaning liquid is discharged from the first single-tube nozzle 41 and lands on the top surface of the substrate W and the top surface of the substrate W is set to 15° to 75°, and is desirably set to 30 to 60°. As described above, since the first single-tube nozzle 41 supplies the first cleaning liquid from obliquely above the top surface of the substrate W, the liquid flow of the first cleaning liquid lands on the top surface of the substrate W with a flow in a direction along a planar direction of the substrate W, specifically, a flow in a direction toward the center O of the substrate W. Then, the first cleaning liquid flows in the direction toward the center O of the substrate W even after landing due to the inertia of the flow of the liquid flow in the direction toward the center O of the substrate W.

Since the substrate W rotates as described above, the first cleaning liquid that has landed on the surface of the substrate W receives the centrifugal force by the rotation and flows toward the outside of the substrate W. However, as illustrated in FIGS. 2 and 3, in the present embodiment, since the first cleaning liquid lands near the center O of the substrate W, the large centrifugal force does not act at such a position near the center O, and there is already a flow toward the center O before landing. Therefore, due to the inertia, the first cleaning liquid forms a liquid bundle that linearly advances in a direction matched with the supply direction of the first single-tube nozzle 41 in plan view and flows on the surface of the substrate W. As a result, the first cleaning liquid that has landed on the top surface of the substrate W passes through the center O of the substrate W. When the first cleaning liquid passes through the center O of the substrate W, the inertial force in the supply direction of the first single-tube nozzle 41 gradually decreases, and the centrifugal force increases toward the outer periphery. Therefore, the first cleaning liquid becomes a liquid flow that flows toward an outer peripheral part while drawing a curve in the rotation direction of the substrate W so that the width gradually increases toward the outer periphery, and is finally discharged from the outer peripheral part of the substrate W.

Regarding the behavior of the first cleaning liquid on the surface of the substrate W described above, it is desirable that a component parallel to the surface of the substrate W of the liquid flow is larger as the landing position is farther away from the center O of the substrate W. For this reason, it is desirable to reduce the incidence angle. In addition, when the rotation speed of the substrate W is excessively high, the inertial force in the liquid flow loses to the centrifugal force, and the liquid flow does not pass through the center O of the substrate W. Therefore, it is not desirable to rotate the substrate W at an excessively high speed, and the rotation speed is desirably 1500 rpm or less, and more desirably 1000 rpm or less.

When the diameter of the first single-tube nozzle 41 is 1 to 5 mm, the flow rate is desirably 500 to 2000 ml/min. When the diameter of the first single-tube nozzle 41 is 5 to 10 mm, the flow rate is desirably 2000 ml/min or more. In addition, when the distance Ra of the landing position A from the center O of the substrate W is excessively large, as described above, it is necessary to increase the flow velocity so that the liquid flow after landing passes through the center of the substrate W by the inertial force. For this reason, it is desirable to set the distance Ra to ⅓ or less of a radius R.

As described above, the first cleaning liquid is supplied from the first single-tube nozzle 41 to the top surface of the substrate W. However, instead of discharging the first cleaning liquid from above the substrate W to the center O of the substrate W at a large incidence angle (for example, 90°), the first cleaning liquid is discharged so as to land before the center O in a direction toward the center O in plan view at a relatively low incidence angle from obliquely above the substrate W, and the landed first cleaning liquid flows so as to pass through the center O of the substrate W. Therefore, rapid liquid replacement is performed even at the center O of the substrate W having the small centrifugal force, and the first cleaning liquid is prevented from stagnating in a center part of the substrate W. In addition, even in a case where the surface of the substrate W is a layer of a soft material such as copper, damage to the surface can be reduced as compared with a case where the incidence angle is large.

The position, discharge direction, diameter, and flow velocity of the second single-tube nozzle 42 are designed such that the second cleaning liquid discharged from the second single-tube nozzle 41 satisfies the following conditions. First, as illustrated in FIG. 1, a landing position B of the second cleaning liquid discharged from the second single-tube nozzle 42 on the top surface of the substrate W is located farther away from the center O of the substrate W than the landing position A of the first cleaning liquid. That is, a distance Rb of the landing position B of the second cleaning liquid from the center O of the substrate W is set to be longer than the distance Ra of the landing position A of the first cleaning liquid from the center O of the substrate W. The distance Rb from the center O of the substrate W to the landing position B of the second cleaning liquid is desirably longer than ¼ of the radius R of the substrate, and more desirably longer than ⅓ of the radius R of the substrate.

Figure 12:
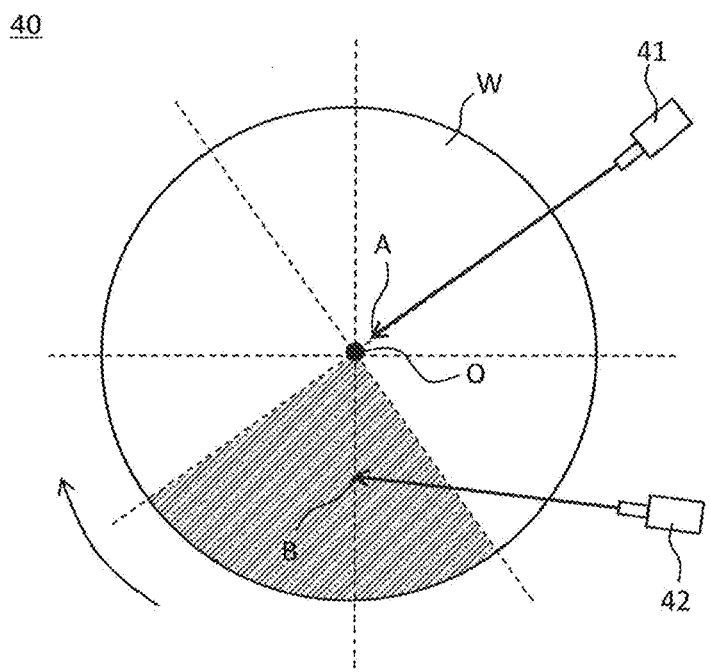
FIG. 12 is a diagram illustrating an example of a landing position of a second cleaning liquid discharged from the second single-tube nozzle.

As illustrated in FIG. 12, when a coordinate system is formed on a plan view of the substrate W in the supply direction of the first single-tube nozzle 41 and the direction passing through the center O of the substrate W and orthogonal thereto, the landing position of the second cleaning liquid discharged from the second single-tube nozzle 42 may be within a region (hatched region in FIG. 12) at 90° on the upstream side in the substrate rotation direction with respect to an extension line from the center O of the substrate W in the supply direction of the first nozzle.

Further, as illustrated in FIG. 1, the second single-tube nozzle 42 discharges the second cleaning liquid in the forward direction of the rotation direction of the substrate W at a position farther away from the center O of the substrate W than the landing position A of the first cleaning liquid such that a part (a part surrounded by an alternate long and short dash line denoted by reference numeral C) is formed in which the liquid flow on the top surface of the substrate W after landing of the first cleaning liquid and the liquid flow on the top surface of the substrate W after landing of the second cleaning liquid are combined. That is, the first single-tube nozzle 41 and the second single-tube nozzle 42 are disposed such that the second single-tube nozzle discharges the second cleaning liquid in the forward direction of the rotation direction of the substrate W at a position farther away from the center O of the substrate W than the landing position of the first cleaning liquid, and a part is generated in which the liquid flow on the top surface of the substrate W after landing of the first cleaning liquid and the liquid flow on the top surface of the substrate W after landing of the second cleaning liquid are combined. As a result, the second cleaning liquid discharged from the second single-tube nozzle 42 lands on the top surface of the substrate W, and then spreads and flows toward the outer periphery on the surface of the substrate W while being partially mixed with the liquid flow of the first cleaning liquid. Here, in a case where the liquid is supplied only to the center as in the related art, if the substrate rotation speed is increased to shorten a cleaning time so as to spread the liquid over the entire surface of the substrate, a liquid layer having a thickness is not formed on the substrate and a cleaning effect may not be sufficiently obtained. On the other hand, in the present embodiment, the second single-tube nozzle discharges the second cleaning liquid in the forward direction of the rotation direction of the substrate at the position farther away from the center of the substrate than the landing position of the first cleaning liquid, and generates a part in which the liquid flow on the top surface of the substrate after landing of the first cleaning liquid and the liquid flow on the top surface of the substrate after landing of the second cleaning liquid are combined. Therefore, the liquid flow along the rotation direction of the substrate from the second nozzle collides with the liquid flow supplied from the first nozzle, and a flow of a liquid in a horizontal plane of the substrate (movement of a liquid film region in the horizontal direction) and a flow of a liquid in a liquid layer having a thickness in the vertical direction can be expected. As a result, it can be expected that the cleaning liquid is spread over the entire surface of the substrate while enhancing the cleaning effect.

Note that the second cleaning liquid discharged from the second single-tube nozzle 42 does not need to flow linearly on the surface of the substrate W after landing. Therefore, for the second cleaning liquid discharged from the second single-tube nozzle 43, conditions such as the diameter and the flow velocity thereof may be set so that the second cleaning liquid flows toward the outer periphery by the centrifugal force acting immediately after landing on the rotating substrate. However, since the point that the surface of the substrate W is damaged when the incidence angle is large is the same as the case of the first single-tube nozzle 41, it is desirable to reduce the incidence angle also for the second single-tube nozzle 42.

Figure 4:
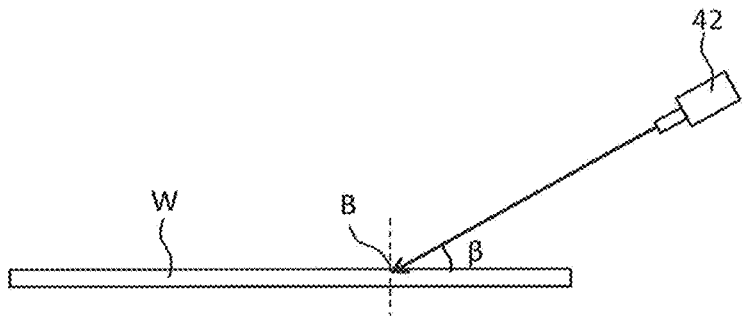
FIG. 4 is a side view illustrating a positional relation between the substrate and the second single-tube nozzle in the cleaning device according to the embodiment.

FIG. 4 is a side view illustrating a positional relation between the substrate W and the second single-tube nozzle 42. FIG. 4 illustrates a vertical surface including a liquid flow of the second cleaning liquid until the second cleaning liquid is discharged from the second single-tube nozzle 42 and lands on the top surface of the substrate W. As illustrated in FIG. 4, an angle (incidence angle) between the liquid flow of the second cleaning liquid until the second cleaning liquid is discharged from the second single-tube nozzle 42 and lands on the top surface of the substrate W and the top surface of the substrate W is set to 15° to 75°, and desirably set to 30° to 60°.

According to the actual verification by the present inventors, it has become clear that, as in the present embodiment, the second single-tube nozzle 42 discharges the second cleaning liquid in the forward direction of the rotation direction of the substrate W at the position farther away from the center O of the substrate W than the landing position A of the first cleaning liquid such that the part is generated in which the liquid flow on the top surface of the substrate W after landing of the first cleaning liquid and the liquid flow on the top surface of the substrate W after landing of the second cleaning liquid are combined, and as a result, replacement efficiency of the cleaning liquid on the top surface of the substrate W is improved regardless of the rotation speed of the substrate W as compared with the case of using other types of nozzles. Since the replacement efficiency of the cleaning liquid is improved, it is possible to quickly supply the cleaning liquid to the top surface of the substrate and effectively flush the liquid and the minute particles on the substrate, and it is possible to shorten the time required for the cleaning step.

The flow rate of the first cleaning liquid discharged from the first single-tube nozzle 41 is desirably larger than the flow rate of the second cleaning liquid discharged from the second single-tube nozzle 42. In order to cause the flow rate of the first cleaning liquid discharged from the first single-tube nozzle 41 to be larger than the flow rate of the second cleaning liquid discharged from the second single-tube nozzle 42, the diameter of the first single-tube nozzle 41 may be larger than the diameter of the second single-tube nozzle 42, or the flow rates of the cleaning liquids supplied to the first single-tube nozzle 41 and the second single-tube nozzle 42 may be adjusted using a flow rate controller.

According to the verification of implementation by the present inventors, it has become clear that, as in the present embodiment, the flow rate of the first cleaning liquid discharged from the first single-tube nozzle 41 is caused to be larger than the flow rate of the second cleaning liquid discharged from the second single-tube nozzle 42, and as a result, the replacement efficiency of the cleaning liquid on the top surface of the substrate W is further improved.

Next, specific examples according to the present embodiment will be described.

Example 1

As Example 1 according to the present embodiment, first, the top surface of the substrate was filled with fluorescent paint while rotating the substrate around the center axis of the substrate as a rotation axis, then the top surface of the substrate was irradiated with light, and photographing of reflected light (that is, luminance value distribution of the top surface of the substrate) by a high-speed camera was started. Next, pure water (DIW) was discharged from a first single-tube nozzle (Φ 1.0 mm) so as to land before the center of the top surface of the substrate, and the pure water (DIW) was also discharged from a second single-tube nozzle (Φ 1.0 mm) separately from the first single-tube nozzle in the forward direction of the rotation direction of the substrate so as to land at a position separated from the center of the top surface of the substrate by ½ of the radius of the substrate, so that the fluorescent paint on the top surface of the substrate was washed and removed by the pure water (DIW). Here, a total flow rate of the pure water (DIW) discharged from the first single-tube nozzle and the second single-tube nozzle was 1000 ml/min, and a flow rate ratio between the first single-tube nozzle and the second single-tube nozzle was 1:1. Then, replacement efficiency of the fluorescent paint on the substrate with the pure water (DIW) was calculated based on a temporal change in the luminance value distribution of the top surface of the substrate. Specifically, an area S1 of a region where a luminance value was less than 25 was calculated from the luminance value distribution of the top surface of the substrate, and a ratio of the area S1 of the region where the luminance value was less than 25 to an area S0 of the substrate was calculated as the replacement efficiency (replacement efficiency=S1/S0×100).

Comparative Example 1

As Comparative Example 1, first, similarly to Example 1, the top surface of the substrate was filled with the fluorescent paint while the substrate was rotated around the center axis of the substrate as the rotation axis, then the top surface of the substrate was irradiated with light, and photographing of the reflected light (that is, luminance value distribution of the top surface of the substrate) by the high-speed camera was started. Next, pure water (DIW) was discharged from two cone nozzles (nozzles for spraying liquids in a conical shape from circular discharge ports) onto the top surface of the substrate, and the fluorescent paint on the top surface of the substrate was washed and removed by the pure water (DIW). Here, a total flow rate of the pure water (DIW) discharged from the two cone nozzles was 1000 ml/min. Then, similarly to Example 1, the replacement efficiency of the fluorescent paint on the substrate with the pure water (DIW) was calculated based on a temporal change in the luminance value distribution on the top surface of the substrate. That is, Comparative Example 1 is different from Example 1 in that the pure water (DIW) is discharged from the two cone nozzles.

Comparative Example 2

As Comparative Example 2, first, similarly to Example 1, the top surface of the substrate was filled with the fluorescent paint while the substrate was rotated around the center axis of the substrate as the rotation axis, then the top surface of the substrate was irradiated with light, and photographing of the reflected light (that is, luminance value distribution of the top surface of the substrate) by the high-speed camera was started. Next, pure water (DIW) was discharged from one single-tube nozzle (Φ3.0 mm) so as to land before the center of the top surface of the substrate, and the fluorescent paint on the top surface of the substrate was washed and removed by the pure water (DIW). Here, a flow rate of the pure water (DIW) discharged from one single-tube nozzle was 1000 ml/min. Then, similarly to Example 1, the replacement efficiency of the fluorescent paint on the substrate with the pure water (DIW) was calculated based on a temporal change in the luminance value distribution on the top surface of the substrate. That is, Comparative Example 2 is different from Example 1 in that the pure water (DIW) is discharged from one single-tube nozzle.

Comparative Example 3

As Comparative Example 3, first, similarly to Example 1, the top surface of the substrate was filled with the fluorescent paint while the substrate was rotated around the center axis of the substrate as the rotation axis, then the top surface of the substrate was irradiated with light, and photographing of the reflected light (that is, luminance value distribution of the top surface of the substrate) by the high-speed camera was started. Next, pure water (DIW) was discharged from one single-tube nozzle (Φ1.0 mm) so as to land before the center of the top surface of the substrate, and the pure water (DIW) was also discharged from one flat nozzle (nozzle for spraying the liquid in a fan shape from a slit-shaped discharge port) in the forward direction of the rotation direction of the substrate so as to land from the center to the outer periphery of the top surface of the substrate, so that the fluorescent paint on the top surface of the substrate was washed and removed by the pure water (DIW). Here, a total flow rate of the pure water (DIW) discharged from one single-tube nozzle and one flat nozzle was 1000 ml/min. Then, similarly to Example 1, the replacement efficiency of the fluorescent paint on the substrate with the pure water (DIW) was calculated based on a temporal change in the luminance value distribution on the top surface of the substrate. That is, Comparative Example 2 is different from Example 1 in that the pure water (DIW) is discharged from one single-tube nozzle and one flat nozzle.

Figure 5:
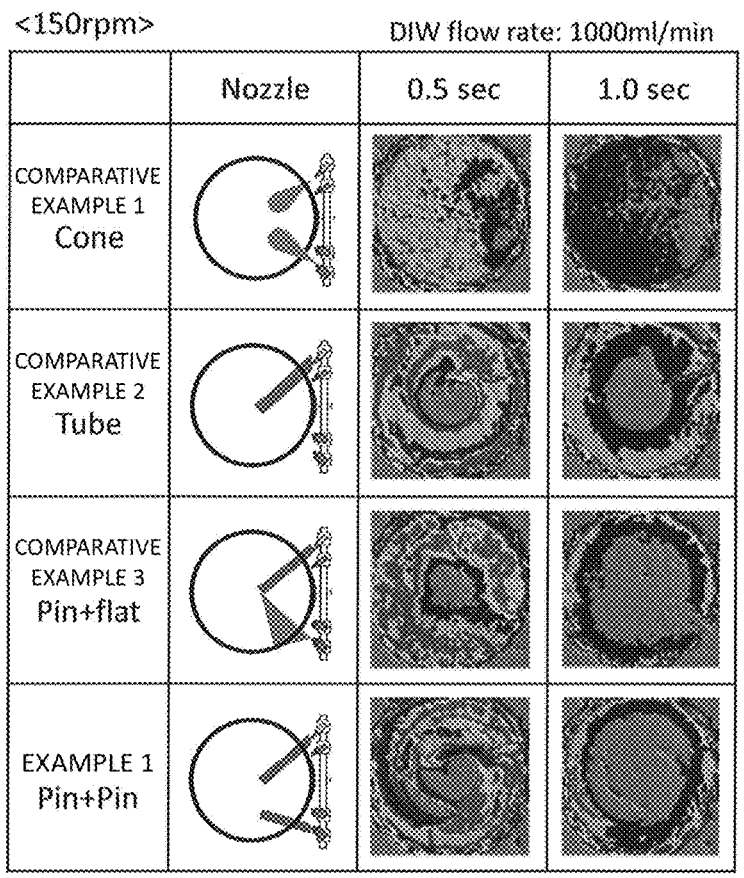
FIG. 5 is a diagram illustrating verification results (luminance value distribution) of Examples and Comparative Examples.
Figure 6:
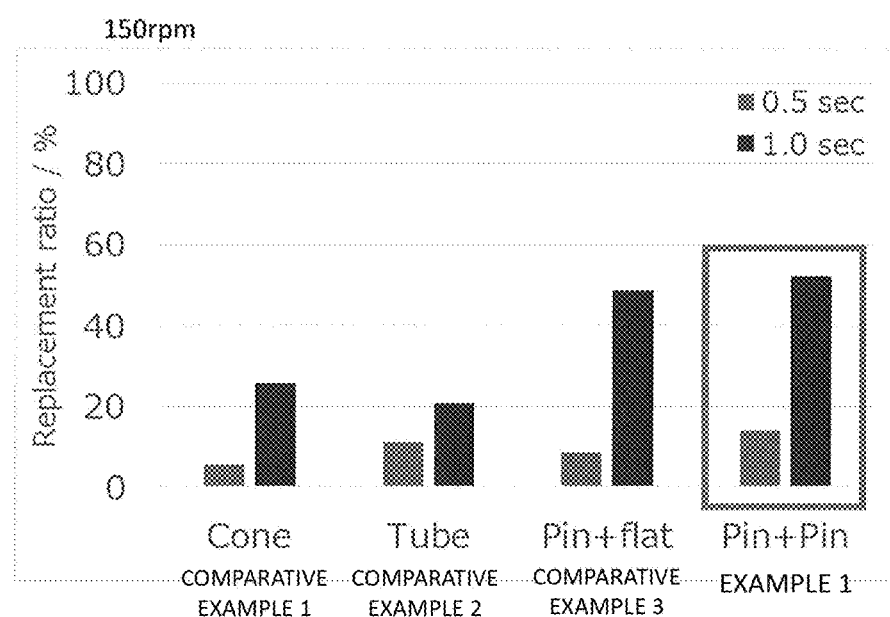
FIG. 6 is a graph illustrating verification results (replacement efficiency) of Examples and Comparative Examples.

FIG. 5 illustrates luminance value distributions after 0.5 seconds and 1.0 seconds from the start of discharge of the pure water (DIW) in a case where the substrate is rotated at 150 rpm as verification results at a low rotation speed in Example 1 and Comparative Examples 1 to 3. FIG. 6 illustrates replacement efficiencies after 0.5 seconds and 1.0 seconds from the start of discharge of the pure water (DIW) in a case where the substrate is rotated at 150 rpm as verification results at a low rotation speed in Example 1 and Comparative Examples 1 to 3.

Figure 7:
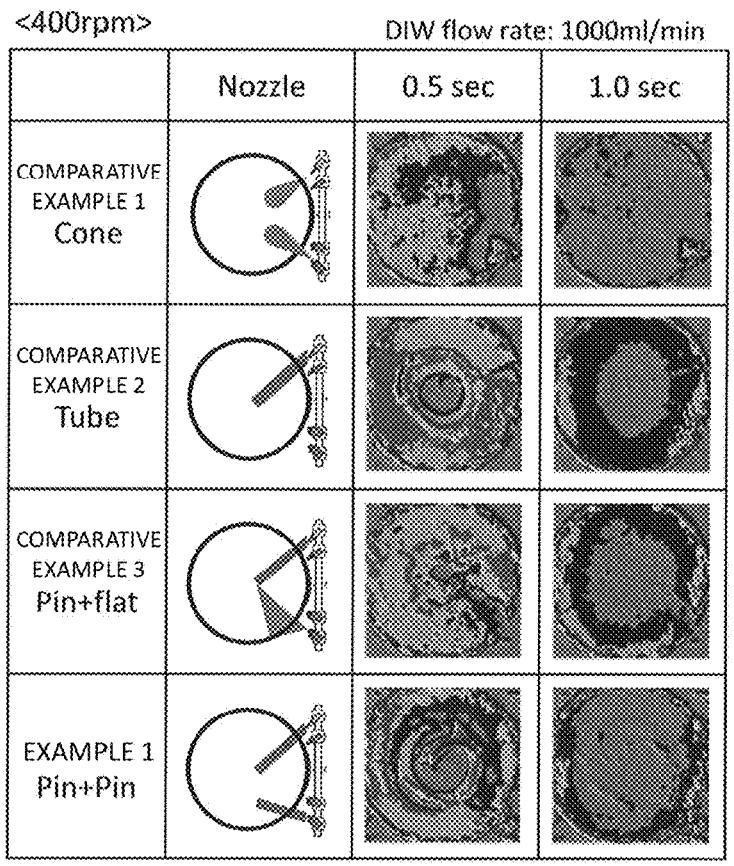
FIG. 7 is a diagram illustrating verification results (luminance value distribution) of Examples and Comparative Examples.
Figure 8:
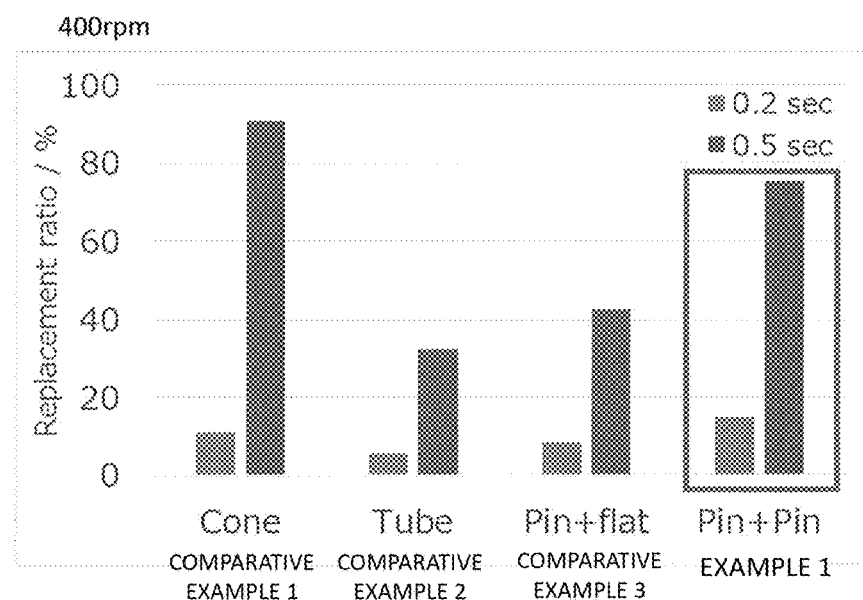
FIG. 8 is a graph illustrating verification results (replacement efficiency) of Examples and Comparative Examples.

FIG. 7 illustrates luminance value distributions after 0.5 seconds and 1.0 seconds from the start of discharge of the pure water (DIW) in a case where the substrate is rotated at 400 rpm as verification results at a high rotation speed in Example 1 and Comparative Examples 1 to 3. FIG. 8 illustrates replacement efficiencies after 0.5 seconds and 1.0 seconds from the start of discharge of the pure water (DIW) in a case where the substrate is rotated at 400 rpm as verification results at a high rotation speed in Example 1 and Comparative Examples 1 to 3.

As illustrated in FIGS. 5 to 7, in Example 1, high replacement efficiency was obtained both when the rotation speed of the substrate was 150 rpm and when the rotation speed of the substrate was 400 rpm. Therefore, it has been found that the second single-tube nozzle discharges the second cleaning liquid in the forward direction of the rotation direction of the substrate at the position farther away from the center of the substrate than the landing position of the first cleaning liquid such that the part is generated in which the liquid flow on the top surface of the substrate after landing of the first cleaning liquid and the liquid flow on the top surface of the substrate after landing of the second cleaning liquid are combined, and as a result, replacement efficiency of the cleaning liquid on the top surface of the substrate W is improved regardless of the rotation speed of the substrate as compared with the case of using other types of nozzles. It is considered that, when "the part in which the first liquid flow and the second liquid flow are combined is generated" in the present embodiment, in a state where the first liquid film flowing on the substrate surface while maintaining the movement flow of the liquid flow as the entire liquid film of the first liquid is formed while maintaining the thickness of the liquid film of the first liquid, the second liquid film flowing on the substrate surface while maintaining the movement direction of the liquid flow as the entire liquid film of the second liquid is formed while maintaining the thickness of the liquid film of the second liquid, and these liquid films at least partially overlap each other.

Example 2

As Example 2 according to the present embodiment, first, similarly to Example 1, the top surface of the substrate was filled with the fluorescent paint while the substrate was rotated around the center axis of the substrate as the rotation axis, then the top surface of the substrate was irradiated with light, and photographing of the reflected light (that is, luminance value distribution on the top surface of the substrate) by the high-speed camera was started. Next, pure water (DIW) was discharged from the first single-tube nozzle (Φ1.9 mm) so as to land before the center of the top surface of the substrate, and the pure water (DIW) was also discharged from the second single-tube nozzle (Φ1.0 mm) separately from the first single-tube nozzle in the forward direction of the rotation direction of the substrate so as to land at the position separated from the center of the top surface of the substrate by ½ of the radius of the substrate, so that the fluorescent paint on the top surface of the substrate was washed and removed by the pure water (DIW). Here, a total flow rate of the pure water (DIW) discharged from the first single-tube nozzle and the second single-tube nozzle was 1000 ml/min, and a flow rate ratio between the first single-tube nozzle and the second single-tube nozzle was about 8:2. Then, similarly to Example 1, the replacement efficiency of the fluorescent paint on the substrate with the pure water (DIW) was calculated based on a temporal change in the luminance value distribution on the top surface of the substrate. That is, Example 2 is different from Example 1 in that the flow rate of the first single-tube nozzle is larger than the flow rate of the second single-tube nozzle.

Comparative Example 4

As Comparative Example 4, first, similarly to Example 1, the top surface of the substrate was filled with the fluorescent paint while the substrate was rotated around the center axis of the substrate as the rotation axis, then the top surface of the substrate was irradiated with light, and photographing of the reflected light (that is, luminance value distribution of the top surface of the substrate) by the high-speed camera was started. Next, pure water (DIW) was discharged from the first single-tube nozzle (Φ1.0 mm) and the second single-tube nozzle (Φ1.0 mm) so as to land before the center of the top surface of the substrate, and the fluorescent paint on the top surface of the substrate was washed and removed by the pure water (DIW). Here, a total flow rate of the pure water (DIW) discharged from the first single-tube nozzle and the second single-tube nozzle was 1000 ml/min, and a flow rate ratio between the first single-tube nozzle and the second single-tube nozzle was 1:1. Then, similarly to Example 1, the replacement efficiency of the fluorescent paint on the substrate with the pure water (DIW) was calculated based on a temporal change in the luminance value distribution on the top surface of the substrate. That is, Comparative Example 4 is different from Example 1 in that the second single-tube nozzle also discharges the pure water (DIW) toward the center of the substrate similarly to the first single-tube nozzle.

Comparative Example 5

As Comparative Example 5, first, similarly to Example 1, the top surface of the substrate was filled with the fluorescent paint while the substrate was rotated around the center axis of the substrate as the rotation axis, then the top surface of the substrate was irradiated with light, and photographing of the reflected light (that is, luminance value distribution of the top surface of the substrate) by the high-speed camera was started. Next, pure water (DIW) was discharged from the first single-tube nozzle (Φ1.0 mm) so as to land before the center of the top surface of the substrate, and the pure water (DIW) was also discharged from the second single-tube nozzle (Φ1.0 mm) separately from the first single-tube nozzle in a direction opposite to the rotation direction of the substrate so as to land at the position separated from the center of the top surface of the substrate by ½ of the radius of the substrate, so that the fluorescent paint on the top surface of the substrate was washed and removed by the pure water (DIW). Here, a total flow rate of the pure water (DIW) discharged from the first single-tube nozzle and the second single-tube nozzle was 1000 ml/min, and a flow rate ratio between the first single-tube nozzle and the second single-tube nozzle was 1:1. Then, similarly to Example 1, the replacement efficiency of the fluorescent paint on the substrate with the pure water (DIW) was calculated based on a temporal change in the luminance value distribution on the top surface of the substrate. That is, Comparative Example 5 is different from Example 1 in that the second single-tube nozzle discharges the pure water (DIW) in the direction opposite to the rotation direction of the substrate.

Figures 9, 10:
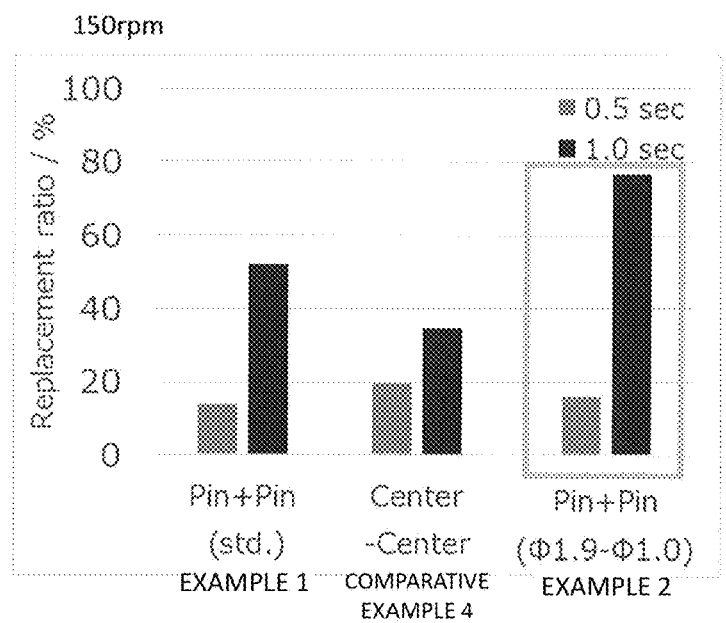
FIG. 9 is a diagram illustrating verification results (luminance value distribution) of Examples and Comparative Examples.
FIG. 10 is a graph illustrating verification results (replacement efficiency) of Examples and Comparative Examples.

FIG. 9 illustrates luminance value distributions after 0.5 seconds and 1.0 seconds from the start of discharge of the pure water (DIW) in a case where the substrate is rotated at 150 rpm as verification results in Examples 1 and 2 and Comparative Examples 4 and 5. FIG. 10 illustrates replacement efficiencies after 0.5 seconds and 1.0 seconds from the start of discharge of the pure water (DIW) in a case where the substrate is rotated at 150 rpm as verification results in Examples 1 and 2 and Comparative Example 4.

As illustrated in FIGS. 9 and 10, in Example 2, replacement efficiency higher than that in Example 1 was obtained. Therefore, it has been found that the replacement efficiency of the cleaning liquid on the top surface of the substrate W is further improved by causing the flow rate of the first cleaning liquid discharged from the first single-tube nozzle to be larger than the flow rate of the second cleaning liquid discharged from the second single-tube nozzle.

Figure 11:
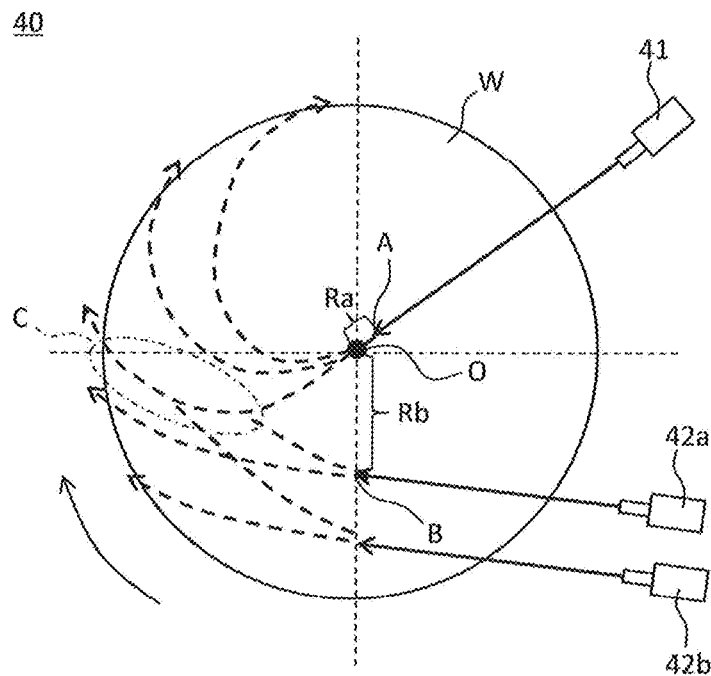
FIG. 11 is a plan view illustrating a positional relation between a substrate and a first single-tube nozzle and a second single-tube nozzle in a cleaning device according to a modification of the embodiment.

In the embodiment illustrated in FIG. 2, the number of second single-tube nozzles 42 is one, but the number is not limited thereto. As illustrated in FIG. 11, the number of second single-tube nozzles 42a and 42b may be two or more. In this case, in order to further increase the replacement efficiency of the cleaning liquid, the flow rate of the cleaning liquid discharged toward the position closer to the center O of the substrate is desirably larger. That is, the flow rate of the first cleaning liquid discharged from the first single-tube nozzle 41 is desirably larger than the flow rate of the second cleaning liquid discharged from the second single-tube nozzle 42a on the center side and larger than the flow rate of the second cleaning liquid discharged from the second single-tube nozzle 42b on the outer peripheral side. In addition, the flow rate of the second cleaning liquid discharged from the second single-tube nozzle 42a on the center side is desirably larger than the flow rate of the second cleaning liquid discharged from the second single-tube nozzle 42b on the outer peripheral side.

In the above description, the fluorescent paint on the substrate was regarded as a liquid (contaminated liquid including particles or the like, or liquid including a chemical liquid component) remaining on the substrate, and the replacement efficiency with pure water was confirmed by experiments by supplying the pure water in various nozzle forms. However, even when the chemical liquid or the like is supplied onto the substrate using the nozzle of the above embodiment, it can be said that the cleaning liquid can be efficiently spread over the entire substrate surface in a shorter time than before. As a result, it is possible to improve the effect of removing the minute particles remaining on the entire substrate surface (or it can also be referred to as the removal capability).

Although the embodiments and the modifications are described by the examples, a range of the present technology is not limited thereto, and changes and modifications according to objects can be made within a range described in claims. Further, the embodiments and the modifications can be appropriately combined within a range in which processing contents are not contradicted.

The invention claimed is:
1. A cleaning device comprising:
a substrate rotation mechanism that holds a substrate and rotates the substrate around a center axis of the substrate as a rotation axis;
a first single-tube nozzle that discharges a first cleaning liquid toward a top surface of the substrate held by the substrate rotation mechanism; and
a second single-tube nozzle that discharges a second cleaning liquid toward the top surface of the substrate held by the substrate rotation mechanism separately from the first single-tube nozzle,
wherein the first single-tube nozzle is configured to discharge the first cleaning liquid along a first line, the first line extending from the first single-tube nozzle to a first location on the top surface of the substrate, the first location being on a first radius of the top surface of the substrate a first distance before a center of the substrate in a direction to the edge of the substrate in alignment with the first single-tube nozzle, the discharge causing a first liquid flow of the first cleaning liquid on the top surface of the substrate after landing, the first liquid flow passing from the first location through the center of the substrate, and wherein the second single-tube nozzle is configured to discharge the second cleaning liquid along a second line, the second line extending from the second single-tube nozzle to a second location on the top surface of the substrate, the second location being on a second radius of the top surface of the substrate a second distance from the center of the substrate toward the outer edge of the substrate, the second distance being greater than the first distance, and the second line extending from the second nozzle in a same direction as a direction of a rotation of the substrate and in a direction where the second line forms a first angle with a third line extending from the center of the substrate to the second location when viewed in a plan view from above, the second discharge causing a second liquid flow of the second cleaning liquid on the top surface of the substrate after the second cleaning liquid lands on the substrate and causing a portion of the first liquid flow and a portion of the second liquid flow to combine, and wherein the third line forms an obtuse second angle with a fourth line extending from the center of the substrate to the first location on a downstream side of the first location in the direction of rotation of the substrate.

2. The cleaning device according to claim 1, wherein a flow rate of the first cleaning liquid discharged from the first single-tube nozzle is larger than a flow rate of the second cleaning liquid discharged from the second single-tube nozzle.

3. The cleaning device according to claim 2, wherein a diameter of the first single-tube nozzle is larger than a diameter of the second single-tube nozzle.

4. The cleaning device according to claim 1, wherein discharge of the first cleaning liquid by the first single-tube nozzle and discharge of the second cleaning liquid by the second single-tube nozzle are performed simultaneously.

5. The cleaning device according to claim 1, wherein the first cleaning liquid and the second cleaning liquid are water or a chemical liquid.

6. The cleaning device according to claim 1, wherein the second radius is longer than ¼ of a radius of the substrate.

7. The cleaning device according to claim 6, wherein the second radius is longer than ⅓ of a radius of the substrate.

8. The cleaning device according to claim 1, wherein an angle between a liquid flow from being discharged from the first single-tube nozzle to landing on the top surface of the substrate and the top surface of the substrate is 15° to 75° when viewed from a side view of the cleaning device.

9. The cleaning device according to claim 1, wherein an angle between a liquid flow from being discharged from the second single-tube nozzle to landing on the top surface of the substrate and the top surface of the substrate is 15° to 75° when viewed from a side view of the cleaning device.

10. The cleaning device according to claim 1, wherein the number of second single-tube nozzles is two or more.

11. A cleaning method comprising:
a step of rotating a substrate around a center axis of the substrate as a rotation axis;

a step of discharging a first cleaning liquid from a first single-tube nozzle toward a top surface of the substrate, wherein the first single-tube nozzle is configured to discharge the first cleaning liquid along a first line, the first line extending from the first single-tube nozzle to a first location on the top surface of the substrate, the first location being on a first radius of the top surface of the substrate a first distance before a center of the substrate in a direction to the edge of the substrate in alignment with the first single-tube nozzle, the discharge causing a first liquid flow of the first cleaning liquid on the top surface of the substrate after landing, the first liquid flow passing from the first location through the center of the substrate, and a step of discharging a second cleaning liquid from a second single-tube nozzle toward the top surface of the substrate separately from the first single-tube nozzle, wherein the second single-tube nozzle discharges the second cleaning liquid along a second line, the second line extending from the second single-tube nozzle to a second location on the top surface of the substrate, the second location being on a second radius of the top surface of the substrate a second distance from the center of the substrate toward the outer edge of the substrate, the second distance being greater than the first distance, and the second line extending from the second nozzle being in a same direction as a direction of a rotation of the substrate and in a direction where the second line forms a first angle with a third line extending from the center of the substrate to the second location when viewed in a plan view from above, the second discharge causing a second liquid flow of the second cleaning liquid on the top surface of the substrate after the second cleaning liquid lands on the substrate and causing a portion of the first flow and a portion of the second flow to combine, and wherein the third line forms an obtuse second angle with a fourth line extending from the center of the substrate to the first location on a downstream side of the first location in the direction of rotation of the substrate.

12. The cleaning method according to claim 11, wherein a flow rate of the first cleaning liquid discharged from the first single-tube nozzle is larger than a flow rate of the second cleaning liquid discharged from the second single-tube nozzle.

13. The cleaning method according to claim 12, wherein a diameter of the first single-tube nozzle is larger than a diameter of the second single-tube nozzle.

14. The cleaning method according to claim 11, wherein discharge of the first cleaning liquid by the first single-tube nozzle and discharge of the second cleaning liquid by the second single-tube nozzle are performed simultaneously.

15. The cleaning method according to claim 11, wherein the first cleaning liquid and the second cleaning liquid are water or a chemical liquid.

16. The cleaning method according to claim 11, wherein the second radius is longer than ¼ of a radius of the substrate.

17. The cleaning method according to claim 16, wherein the second radius is longer than ⅓ of a radius of the substrate.

18. The cleaning method according to claim 11, wherein an angle between a liquid flow from being discharged from the first single-tube nozzle to landing on the top surface of the substrate and the top surface of the substrate is 15° to 75° when viewed from a side view of the cleaning device.

\* \* \* \* \*